United States Patent [19]

Yamanaka et al.

[11] Patent Number: 4,774,208

[45] Date of Patent: Sep. 27, 1988

[54] LOW TEMPERATURE SEALING COMPOSITION WITH SYNTHETIC ZIRCON

[75] Inventors: Toshio Yamanaka; Ichiro Matsuura; Fumio Yamaguchi, all of Shiga, Japan

[73] Assignee: Nippon Electric Glass Company, Limited, Shiga, Japan

[21] Appl. No.: 14,289

[22] Filed: Feb. 13, 1987

[30] Foreign Application Priority Data

Feb. 17, 1986 [JP] Japan .................................. 61-32264

[51] Int. Cl.[4] ........................ C03C 8/24; C03C 14/00; C03C 8/14; C03C 8/20

[52] U.S. Cl. ........................................ 501/15; 501/17; 501/18; 501/32

[58] Field of Search ........................ 501/15, 17, 18, 32

[56] References Cited

U.S. PATENT DOCUMENTS 4,621,064 11/1986 Matsuura et al. .................... 501/18

*Primary Examiner*—Ferris H. Lander

*Attorney, Agent, or Firm*—Kurt Kelman

[57] ABSTRACT

A sealing composition suitable for sealing alumina packages for integrated circuits at a temperature below about 450° C. for a short time of about 10 minutes. The composition is a mixture of 50–80 wt % vitreous PbO-$B_2O_3$ solder glass powder having a deformation point of 350° C. or less, 0–45 wt % low thermal expansion ceramic powder and 2–40 wt % zircon powder. The zircon powder is of a synthetic zircon artificially prepared to eliminate radioactive impurities such as uranium and/or thorium and contains 0.5–7 wt % $Fe_2O_3$, MnO and/or ZnO without alkali impurities and without non-reacted zirconium oxide. The composition has an improved flowability.

4 Claims, No Drawings

LOW TEMPERATURE SEALING COMPOSITION WITH SYNTHETIC ZIRCON

BACKGROUND OF THE INVENTION

1. Field of the Invention

The present invention relates to sealing compositions and, in particular, to compositions for sealing alumina ceramic packages in which integrated circuits or other solid state devices are encapsulated.

2. Prior Art

A known composition for sealing alumina ceramic packages comprises a mixture of vitreous older glass powder, lead titanate powder, and zircon (zirconium silicate, $ZrSiO_4$) powder, as disclosed in Japanese Patent Publication No. 56-49861. This known sealing composition has good mechanical strength and resistance to thermal shock. However, it has high dielectric constant and therefore, is not good to seal packages containing large-scaled integrated circuits such as memories. Further, the composition disadvantageously radiates α-rays because zircon usually available includes radioactive impurities such as uranium and/or thorium therein whereby soft errors are caused in integrated circuits of DRAM and CCD types.

U.S. Pat. Nos. 4,405,722 and 4,421,947 disclose sealing compositions including zircon which is not desired by the above-described reason.

U.S. Pat. No. 4,405,722 discloses a mixture of vitreous glass powder and cordierite powder including β-eucryptite, β-spodumene, zircon, and/or lead titanate as optional ingredients. The sealing composition, even if zircon is not used, is not high in mechanical strength, and has a tendency to suffer from micro-cracks caused by heat shock resulting in damage to the hermetical seal.

U.S. Pat. No. 4,421,947 discloses a sealing composition having crystalline filler other than zircon, but the sealing composition is not a powdery mixture and has a high sealing temperature of about 1225° F.

Another known sealing composition comprises a mixture of $PbO-B_2O_3$ or $PbO-B_2O_3-ZnO$ solder glass powder and non-inert zinc zirconium silicate powder as disclosed in U.S. Pat. No. 3,963,505. However, the sealing composition is not so desirable because zinc zirconium silicate included therein includes radioactive impurities such as uranium and/or thorium.

U.S. Pat. No. 4,621,064 by Matsuura et al proposes to use synthetic zircon in place of natural zircon in a sealing composition. That is, the proposed sealing composition is a mixture of 50–80 wt % vitreous solder glass powder of $PbO-B_2O_3$ system having a deformation point of 350° or less, 1–35 wt % zinc material powder, and 1–35 wt % synthetic zircon powder artificially prepared to eliminate radioactive impurities such as uranium and/or thorium.

The sealing composition using the synthetic zircon radiates no α-ray, but the composition has problems of flowability degraded and thermal expansion coefficient increased by inclusion of the synthetic zircon increased.

The present invention found out that the problems were caused by presence of non-reacted zirconium oxide ($ZrO_2$) in the synthetic zircon.

The synthetic zircon is obtained by reacting purified silica ($SiO_2$) sand and purified zirconium oxide ($ZrO_2$) using a reaction accelerator such as NaF, NaCl, and/or $Na_2SO_4$. However, the obtained synthetic zircon includes non-reacted zirconium oxide.

Further, the synthetic zircon includes the reaction accelerator NaF, NaCl and/or $Na_2SO_4$. It is also disadvantageous that the synthetic zircon includes alkali such as Na because the sealing composition using the synthetic zircon is degraded in electric insulation.

SUMMARY OF THE INVENTION

It is an object of the present invention to provide a low temperature sealing composition which radiates no β-rays, and has a reduced thermal expansion coefficient, an increased flowability to enable to seal packages for a short sealing time period at a low temperature of 450° C. or less, and a sufficient mechanical strength.

According to the present invention, a low temperature sealing composition is obtained which radiates no α-rays. The sealing composition consists of a powdery mixture of 50–80 wt % glass powder, the glass being vitreous $PbO-B_2O_3$ solder glass containing substantially no radioactive substances and having a deformation point of 350° C. or less, 0–45 wt % low thermal expansion ceramic powder, and 2–40 wt % synthetic zircon artificially prepared substantially to exclude radioactive substances present in natural zircon. The synthetic zircon contains 0.5–7 wt % of at least one of $Fe_2O_3$, MnO, and ZnO, but no alkali impurities. The synthetic zircon substantially contains no zirconium oxide non-reacted with silica.

If the $PbO-B_2O_3$ solder glass used is devitrifiable, the sealing temperature is elevated so that the sealing composition is not able to seal at 450° C. or less. If the $PbO-B_2O_3$ solder glass is vitreous but has a deformation point higher than 350° C., the sealing temperature of the resultant composition is also elevated higher than 450° C. Therefore, the solder glass of $PBO-B_2O_3$ system used must be vitreous and have a deformation point of 350° C. or less.

If the amount of the vitreous solder glass is less than 50 wt %., the flowability of the composition is reduced so that sealing cannot be performed at a temperature of 450° C. or less. On the other hand, if the amount of the solder glass exceeds 80 wt %., the thermal expansion coefficient of the composition becomes too high so that resistance to heat shock is reduced.

Therefore, the amount of the vitreous solder glass of $PbO-B_2O_3$ system must be selected within a range of 50–80 wt %, more advantageously, 60–75 wt %.

The zircon powder is prepared by treating zircon sand by alkali fusion to make sodium zirconate, dissolving the sodium zirconate in hydrochloric acid aqueous solution to make zirconium hydrochloric acid solution, subjecting the solution to recrystallization to obtain zirconium oxychloride, treating the zirconium oxychloride with sodium hydroxide to form the zirconium oxide with silica sand and a reaction accelerator or accelerators of $Fe_2O_3$, MnO, and/or ZnO, and baking the mixture to form the synthetic zircon.

The prepared synthetic zircon substantially contains no non-reacted zirconium oxide by the reason of use of the reaction accelerator or accelerators of $Fe_2O_3$, MnO, and/or ZnO. Although the reaction accelerator or accelerators are contained in the synthetic zircon, they do not badly affect the desired properties of the synthetic zircon. The reaction accelerator or accelerators should be used so that the synthetic zircon includes 0.5–7 wt. % of the reaction accelerator or accelerators of %. The use of the accelerator or accelerators below 0.5 wt %.

does not achieve the reaction acceleration but the presence of the accelerator or accelerators above 7 wt % in the synthetic zircon results in reduction of flowability and increase of the thermal expansion coefficient of the sealing composition containing the synthetic zircon.

The synthetic zircon powder should be used in an amount of 2 wt % at minimum so as to obtain a sealing composition having a sufficient mechanical strength. However, the amount of the synthetic zircon is 40 wt % at maximum. Use of the synthetic zircon above 40 wt % degrades the flowability of the sealing composition.

The low thermal expansion ceramic powder, when being contained together with the synthetic zircon in the sealing composition, lowers the sealing temperature of the sealing composition without changing the thermal expansion coefficient. However, the low thermal expansion ceramic powder should be used in an amount of 45 wt % at maximum because use of the thermal expansion ceramic powder above 45 wt % reduces the flowability of the sealing composition.

One or more selected from the group of lead titanate, β-eucryptite, cordierite, Willemite, zinc material, and $SnO_2$ solid solution are used as the low thermal expansion powder. The zinc material means one including zinc oxide as the major ingredient.

DETAILED DESCRIPTION OF PREFERRED EMBODIMENTS

A preferred composition of the vitreous $PbO$-$B_2O_3$ solder glass used in the present invention consists essentially, by weight, of 40–90% PbO, 8–15% $B_2O_3$, 0.5–3% ($SiO_2$+$Al_2O_3$), 0.5–5% ZnO, and 0–40% $Tl_2O$.

When PbO is less than 40 wt %, the viscosity of the glass increases, but when PbO is more than 90 wt %, the glass becomes devitrifiable. Therefore, PbO is 40 wt % at minimum and 90 wt % at maximum.

Less than 8 wt % $B_2O_3$ makes the glass devitrifiable and $B_2O_3$ more than 15 wt % increases the viscosity of the glass. Therefore, the amount of should be 8–15 wt % $B_2O_3$.

When the total amount of $SiO_2$ and $Al_2O_3$ is less than 0.5 wt %, the glass becomes devitrifiable. When it is more than 3 wt %, the viscosity of the glass increases.

ZnO is used in an amount of 0.5 wt % at minimum for comparative reduction of the viscosity of the glass without increase of its thermal expansion coefficient. However, more than 5 wt % ZnO makes the glass devitrifiable.

$Tl_2O$ can be optionally used by partially replacing PbO so as to reduce the viscosity of the glass, but use of more than above 40 wt % $Tl_2O$ degrades the chemical resistance of the glass.

The vitreous solder glass can include CuO, $Bi_2O_3$, $SnO_2$, BaO and/or F in a total amount of 5 wt % or less, but should contain substantially no radioactive substances.

Four example glasses A, B, C and D as listed in Table 1 were produced by using red lead, boric acid, silica sand, alumina, zinc oxide, talium carbonate, lead fluoride, and barium carbonate as the materials for respective ingredients of the glasses. These materials

TABLE 1

| Ingredients | Examples | | | |
|---|---|---|---|---|
| | Glass A | Glass B | Glass C | Glass D |
| PbO (wt %) | 84.8 | 84.3 | 81.2 | 60.4 |
| $B_2O_3$ (wt %) | 12.3 | 11.9 | 12.3 | 10.3 |
| $SiO_2$ (wt %) | 1.0 | 1.0 | 1.0 | 0.9 |
| $Al_2O_3$ (wt %) | 0.5 | — | — | 0.6 |
| ZnO (wt %) | 1.4 | 2.8 | 4.0 | 3.1 |
| $Tl_2O$ (wt %) | — | — | — | 23.0 |
| F (wt %) | — | — | 1.5 | — |
| BaO (wt %) | — | — | — | 1.7 |
| Transition Point (°C.) | 307 | 300 | 280 | 260 |
| Deformation Point (°C.) | 327 | 325 | 300 | 283 |

were weighed and mixed according to weight percent indicated in Table 1. The batch for each of glasses A through D was melted at 800° C. for 60 minutes in a platinum crucible in an electric furnace. The molten glass was quenched between counter rotating stainless steel rollers. The resultant glass flake was milled in an aluminum ball mill and then was screened through 200 mesh stainless steel screen.

Three examples A, B and C of the synthetic zircon are presented in Table 2. Those synthetic zircon examples A–C were produced from natural zircon, silica sand and reaction accelerators by the following steps.

TABLE 2

| Ingredients | Examples | | |
|---|---|---|---|
| | Synthetic Zircon A | Synthetic Zircon B | Synthetic Zircon C |
| $ZrO_2$ (wt %) | 65.9 | 65.2 | 64.6 |
| $SiO_2$ (wt %) | 32.2 | 31.8 | 31.6 |
| $Fe_2O_3$ (wt %) | 1.9 | — | — |
| MnO (wt %) | — | 3.0 | — |
| ZnO (wt %) | — | — | 3.8 |

Zircon sand was subjected to alkali fusion to obtain natrium zirconate. The sodium zirconate was dissolved in hydrochloric acid aqueous solution to form zirconium hydrochloric acid solution. The solution was subjected to several recrystallization treatments to eliminate radioactive impurities and to obtain zirconium oxychloride. The zirconium oxychloride was treated by sodium hydroxide to form zirconium hydroxide. The zirconium hydroxide was baked and zirconium oxide was obtained.

The zirconium oxide ($ZrO_2$), silica sand ($SiO_2$) of a high purity, and a reaction accelerator such as $Fe_2O_3$, MnO, or ZnO were weighed and mixed according to weight percent indicated in Table 2. Each mixture was baked for 16 hours at 1400° C. The baked body was milled and then was screened through 250 mesh stainless steel screen. Thus, the synthetic zircon powder was obtained, which included substantially no radioactive impurities such as uranium and/or thorium which were included in the natural zircon.

Table 3 demonstrates thirteen (13) examples of the sealing composition using glass examples A–D in Table 1 and synthetic zircon examples A–C in Table 2 together with or without low thermal expansion ceramic powders shown in Table 3 and properties of those sealing compositions.

TABLE 3

| Examples No. | 1 | 2 | 3 | 4 | 5 | 6 | 7 | 8 | 9 | 10 | 11 | 12 | 13 |
|---|---|---|---|---|---|---|---|---|---|---|---|---|---|
| Glass (wt %) | | | | | | | | | | | | | |

TABLE 3-continued

| Examples No. | 1 | 2 | 3 | 4 | 5 | 6 | 7 | 8 | 9 | 10 | 11 | 12 | 13 |
|---|---|---|---|---|---|---|---|---|---|---|---|---|---|
| A | 67.2 | — | — | 66.3 | 65.8 | — | 52.1 | — | — | — | 79.0 | — | 30.3 |
| B | — | 66.0 | 67.0 | — | — | 63.0 | — | — | — | — | — | 67.0 | 30.3 |
| C | — | — | — | — | — | — | — | 63.9 | — | — | — | — | — |
| D | — | — | — | — | — | — | — | — | 62.4 | 66.8 | — | — | — |
| Synthetic Zircon (wt %) | | | | | | | | | | | | | |
| A | 32.8 | — | 17.9 | — | 16.4 | 10.0 | 7.0 | — | 18.7 | — | — | 19.0 | — |
| B | — | 32.0 | — | 7.7 | — | — | — | 18.7 | — | — | — | — | 16.4 |
| C | — | — | — | — | — | — | — | — | — | 20.0 | 5.0 | 0 | 0 |
| Low Temperature Expansion Ceramic (wt %) | | | | | | | | | | | | | |
| Lead Titanate | — | — | — | — | — | — | 40.9 | — | — | — | — | — | — |
| $\beta$-eucryptite | — | — | — | — | — | — | — | — | — | — | 16.0 | — | — |
| Cordierite | — | — | — | — | — | — | — | — | — | 13.2 | — | — | — |
| Willemite | — | — | — | — | — | — | — | — | — | — | — | 14.0 | — |
| Zinc Material | — | 2.0 | 15.1 | 26.0 | 17.8 | 27.0 | — | 17.4 | 18.9 | — | — | — | — |
| $SnO_2$ Solid Solution | — | — | — | — | — | — | — | — | — | — | — | — | 23.0 |
| Sealing Temperature (°C.) | 435 | 425 | 430 | 420 | 430 | 420 | 440 | 410 | 405 | 415 | 440 | 440 | 440 |
| Sealing Time (minutes) | 10 | 10 | 10 | 10 | 10 | 10 | 10 | 10 | 10 | 10 | 10 | 10 | 10 |
| Thermal Expansion Coefficient ($\times 10^{-7}$/°C., 30–250° C.) | 70 | 69 | 65 | 64 | 64 | 64 | 64 | 68 | 69 | 68 | 67 | 68 | 69 |
| Shearing Strength (Kg) | 400 | 410 | 370 | 340 | 360 | 335 | 410 | 330 | 335 | 330 | 300 | 330 | 360 |

Description is now made as to low thermal expansion ceramic powders shown in Table 3.

Lead titanate powder was prepared by mixing litharge (PbO) and titanium oxide ($TiO_2$) at a ratio of the stoichiometric composition of $PbTiO_3$, baking the resultant mixture for 2 hours at 1150° C., milling the baked body, and screening it through 250 mesh screen of stainless steel.

Beta-eucryptite powder was prepared by mixing lithium carbonate, alumina, and silica sand at a ratio of the stoichiometric composition of $Li_2O.Al_2O_3.2SiO_2$, baking the resultant mixture for 5 hours at 1250° C., milling the baked body, and screening it through 250 mesh stainless steel screen.

Cordierite was produced by a method of making crystallized glass. That is, magnesia, alumina and silica sand were mixed at a ratio of the stoichiometric composition of $2MgO.2Al_2O_3.5SiO_2$ and then melted for 4 hours at 1580° C. in a platinum crucible. The metal was quenched between counter rotating stainless steel rollers to form a glass flake. The flake was milled and then screened through 150 mesh screen of stainless steel. The screened glass powder was heated at 1000° C. for 12 hours to form cordierite crystals, which were milled to have particle size under 350 mesh. Thus, the cordierite powder was obtained.

Willemite powder was produced by mixing zinc oxide and silica sand at a ratio of the stoichiometric composition of $2ZnO.SiO_2$, baking the resultant mixture at 1400° C. for 16 hours, milling the baked body and then screening it by 250 mesh screen of stainless steel.

Zinc material used in the present invention can consist, by weight, of 68–75% ZnO, 23–28% $SiO_2$, and 0.1–8% $Al_2O_3$.

Zinc material powder was produced by the following steps. Zinc oxide, silica sand, and alumina were weighed and mixed to contain 70.6 wt % ZnO, 24.7 wt % $SiO_2$, and 4.7 wt % $Al_2O_3$. A resultant mixture was baked at 1440° C. for 15 hours and then milled. The milled powder was screened through 250 mesh screen of stainless steel. Thus, the zinc material powder was obtained.

To produce $SnO_2$ solid solution powder, tin oxide, titanium oxide, and manganese dioxide were weighed and mixed to contain 93 wt % $SnO_2$, 2 wt % $TiO_2$, and 5 wt % MnO. The resultant mixture was baked at 1400° C. for 16 hours. The resultant baked body was milled and then screened through 250 mesh stainless steel screen.

Each sealing composition of 1–13 in Table 3 is a mixture of each glass example of A–D in Table 1, each synthetic zircon example of A–C, and each low thermal expansion ceramic in Table 3.

Each sealing composition of 1–13 in Table 3 was mixed with a suitable vehicle to form a paste. An example of the vehicle used was $\alpha$-terpineol solution of 5% acrylic resin. The paste was printed onto an alumina ceramic package (16 SSI) and was heat-treated to seal the package at the sealing temperature for the sealing time period as described in Table 3.

The shearing strength along the longer side of the package and the thermal expansion coefficient of the sealing composition were measured and were shown in Table 3.

In comparison with the present invention, a synthetic zircon was prepared using sodium sulfate as the reaction accelerator. The synthetic zircon will be referred to as "comparing zircon".

Of the comparing 32.8 wt % Zircon and 67.2 wt % of the glass A (in Table 1) were mixed with one another to form a sealing composition, which will be referred to as "comparing sample 1".

A flow button test was performed with to comparing sample 1 and sealing composition example No. 1 in Table 3.

The flow button test is a test for examining flowability of a sealing composition and comprises steps the of loading a test material of the weight (gr.) corresponding to its specific gravity (g/cm$^3$) into a mould, pressing the material by application of pressing force of 20 Kg/cm$^2$ to form a button piece having a diameter of 20 mm and a thickness of about 6 mm, heating the button piece on a glass plate, and measuring an outer diameter of the button piece deformed. An increase of the outer diameter by heating represents the flowability.

In the present flow button test, the heating temperature and time period were 435° C. and 10 minutes, respectively.

The outer diameter measured for the sealing composition example No. 1 was 23.0 mm, while the outer diameter for comparing sample 1 was 19.0 mm.

Of glass 65.8 wt % A, (in Table 1) 19.8 wt % of zinc material and 16.4 wt % of the comparing zircon were mixed to form another comparing sample 2.

The flow button test was carried out as to comparing sample 2 and sealing composition example No. 5 in Table 3. The heating temperature and time period were 430° C. and 10 minutes, respectively. For No. 5 example, an outer diameter 23.5 mm was measured, but comparing sample 2 was measured to have a smaller outer diameter of 20.5 mm.

These flow button tests showed that sealing compositions according to the present invention were excellent in flowability.

What is claimed is:

1. A low temperature sealing composition which radiates no α-rays, consisting of a powdery mixture of 50–80 wt % glass powder, said glass being vitreous $PbO-B_2O_3$ solder glass containing substantially no radioactive substances and having a deformation point of 350° C. or less, 0–45 wt % low thermal expansion ceramic powder, and 2–40 wt % synthetic zircon artificially prepared substantially to exclude radioactive substances present in natural zircon, said synthetic zircon containing 0.5–7 wt % of at least one of $Fe_2O_3$, MnO and ZnO but no alkali impurities and no non-reacted zirconium oxide.

2. A low temperature sealing composition as claimed in claim 1, wherein said vitreous solder glass consists essentially, by weight, of 40–90% PbO, 8–15% $B_2O_3$, 0.5–3% ($SiO_2+Al_2O_3$), 0.5–5% ZnO, and 0–40% $Tl_2O$.

3. A low temperature sealing composition as claimed in claim 1, wherein said low thermal expansion ceramic powder consists of at least one of the group of lead titanate, β-eucryptite, cordierite, Willemite, zinc material, and $SnO_2$ solid solution crystal.

4. A low temperature sealing composition as claimed in claim 1, wherein said synthetic zircon is a chemical compound produced by treating zircon sand by alkali fusion to make sodium zirconate, dissolving said sodium zirconate in hydrochloric acid aqueous solution to make zirconium hydrochloric acid solution, subjecting said solution to recrystallization to obtain zirconium oxychloride, treating said zirconium oxychloride with sodium hydroxide to form zirconium hydroxide, baking said zirconium hydroxide to form zirconium oxide, mixing said zirconium oxide with silica sand and at least one of $Fe_2O_3$, MnO, and ZnO to form a mixture, and baking the mixture to form said synthetic zircon.

* * * * *